(12) United States Patent
Lin et al.

(10) Patent No.: US 10,153,179 B2
(45) Date of Patent: Dec. 11, 2018

(54) CARRIER WARPAGE CONTROL FOR THREE DIMENSIONAL INTEGRATED CIRCUIT (3DIC) STACKING

(71) Applicant: Taiwan Semiconductor Manufacturing Company, Ltd., Hsin-Chu (TW)

(72) Inventors: Jing-Cheng Lin, Hsin-Chu (TW); Shih Ting Lin, Taipei (TW); Chen-Hua Yu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 1078 days.

(21) Appl. No.: 13/779,554

(22) Filed: Feb. 27, 2013

(65) Prior Publication Data
US 2014/0057391 A1   Feb. 27, 2014

Related U.S. Application Data

(60) Provisional application No. 61/693,083, filed on Aug. 24, 2012.

(51) Int. Cl.
*H01L 21/56* (2006.01)
*H01L 23/00* (2006.01)
(Continued)

(52) U.S. Cl.
CPC ............ *H01L 21/56* (2013.01); *H01L 21/561* (2013.01); *H01L 21/563* (2013.01); *H01L 21/568* (2013.01); *H01L 23/3128* (2013.01); *H01L 24/96* (2013.01); *H01L 24/97* (2013.01); *H01L 25/0657* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01);
(Continued)

(58) Field of Classification Search
CPC ..... H01L 21/56; H01L 21/561; H01L 21/568; H01L 24/96; H01L 24/97; H01L 23/3126; H01L 21/563; H01L 24/13; H01L 24/16; H01L 24/32; H01L 24/73; H01L 24/81; H01L 24/883; H01L 24/92
See application file for complete search history.

(56) References Cited

U.S. PATENT DOCUMENTS 6,452,278 B1   9/2002   DiCaprio et al.
7,655,501 B2   2/2010   Yang et al.
(Continued)

FOREIGN PATENT DOCUMENTS

CN   101202253 A   6/2008
CN   102024802 A   4/2011
(Continued)

*Primary Examiner* — Savitr Mulpuri
(74) *Attorney, Agent, or Firm* — Slater Matsil, LLP (57) ABSTRACT

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die. The substrate may be formed from one of an organic substrate, a ceramic substrate, a silicon substrate, a glass substrate, and a laminate substrate.

9 Claims, 12 Drawing Sheets

(51) Int. Cl.
*H01L 23/31* (2006.01)
*H01L 25/065* (2006.01)

(52) U.S. Cl.
CPC ............ *H01L 2224/131* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/73204* (2013.01); *H01L 2224/81005* (2013.01); *H01L 2224/83005* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06562* (2013.01); *H01L 2225/06565* (2013.01); *H01L 2924/141* (2013.01); *H01L 2924/1431* (2013.01); *H01L 2924/1434* (2013.01); *H01L 2924/157* (2013.01); *H01L 2924/15311* (2013.01); *H01L 2924/15787* (2013.01); *H01L 2924/15788* (2013.01); *H01L 2924/18161* (2013.01); *H01L 2924/351* (2013.01); *H01L 2924/3511* (2013.01)

(56) References Cited

U.S. PATENT DOCUMENTS

| | | | | |
|---|---|---|---|---|
| 7,915,080 | B2* | 3/2011 | Takahashi | H01L 21/56 257/E21.705 |
| 8,008,121 | B2* | 8/2011 | Choi | H01L 24/29 257/127 |
| 8,017,445 | B1* | 9/2011 | Chang | H01L 23/49503 257/669 |
| 8,304,874 | B2* | 11/2012 | Lee | H01L 21/568 257/686 |
| 8,471,374 | B2* | 6/2013 | Kim | H01L 21/6835 257/686 |
| 8,759,959 | B2* | 6/2014 | Yim | H01L 25/50 257/686 |
| 8,937,381 | B1* | 1/2015 | Dunlap | H01L 23/3128 257/686 |
| 8,993,377 | B2* | 3/2015 | Koo | H01L 21/561 257/E21.499 |
| 9,064,883 | B2* | 6/2015 | Meyer | H01L 23/3107 |
| 9,209,163 | B2* | 12/2015 | Kao | H01L 24/73 |
| 2007/0096332 | A1 | 5/2007 | Satoh et al. | |
| 2010/0133704 | A1* | 6/2010 | Marimuthu | H01L 21/565 257/778 |
| 2010/0244233 | A1 | 9/2010 | Kim et al. | |
| 2011/0024890 | A1* | 2/2011 | Yang | H01L 21/486 257/686 |
| 2011/0062592 | A1 | 3/2011 | Lee et al. | |
| 2011/0068459 | A1 | 3/2011 | Pagaila et al. | |
| 2011/0266693 | A1 | 11/2011 | Simmons-Matthews | |
| 2011/0278721 | A1 | 11/2011 | Choi et al. | |
| 2011/0278732 | A1* | 11/2011 | Yu | H01L 23/481 257/774 |
| 2011/0287582 | A1 | 11/2011 | Shimada et al. | |
| 2012/0032340 | A1 | 2/2012 | Choi et al. | |
| 2012/0070936 | A1* | 3/2012 | Guha | H01L 21/02422 438/73 |
| 2012/0070939 | A1* | 3/2012 | Dunne | H01L 21/563 438/110 |
| 2012/0074585 | A1 | 3/2012 | Koo et al. | |
| 2012/0074587 | A1 | 3/2012 | Koo et al. | |
| 2012/0111923 | A1 | 5/2012 | Lee et al. | |
| 2012/0181673 | A1 | 7/2012 | Pagaila et al. | |
| 2013/0155639 | A1* | 6/2013 | Ogawa | H01L 23/552 361/816 |
| 2013/0214401 | A1* | 8/2013 | Lin | H01L 23/49816 257/690 |
| 2013/0277841 | A1* | 10/2013 | Lii | H01L 25/105 257/741 |

FOREIGN PATENT DOCUMENTS

| | | |
|---|---|---|
| CN | 102456588 | 5/2012 |
| CN | 102543772 A | 7/2012 |
| KR | 20100109241 | 10/2010 |
| KR | 201184470 | 9/2012 |
| WO | 2008129424 | 10/2008 |

* cited by examiner

CARRIER WARPAGE CONTROL FOR THREE DIMENSIONAL INTEGRATED CIRCUIT (3DIC) STACKING

CROSS-REFERENCE TO RELATED APPLICATIONS

This application claims the benefit of U.S. Provisional Application No. 61/693,083, filed on Aug. 24, 2012, entitled "Carrier Warpage Control for 3DIC Stacking," which application is hereby incorporated herein by reference.

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic packages.

Unfortunately, conventional processes used to fabricate the PoP devices may not be able to sufficiently prevent the packages from warping. This is particularly true when relatively thin dies or integrated circuits are being stacked.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to present embodiments in a specific context, namely a package-on-package (PoP) semiconductor device. The concepts in the disclosure may also apply, however, to other semiconductor structures or circuits.

Figure 1A:
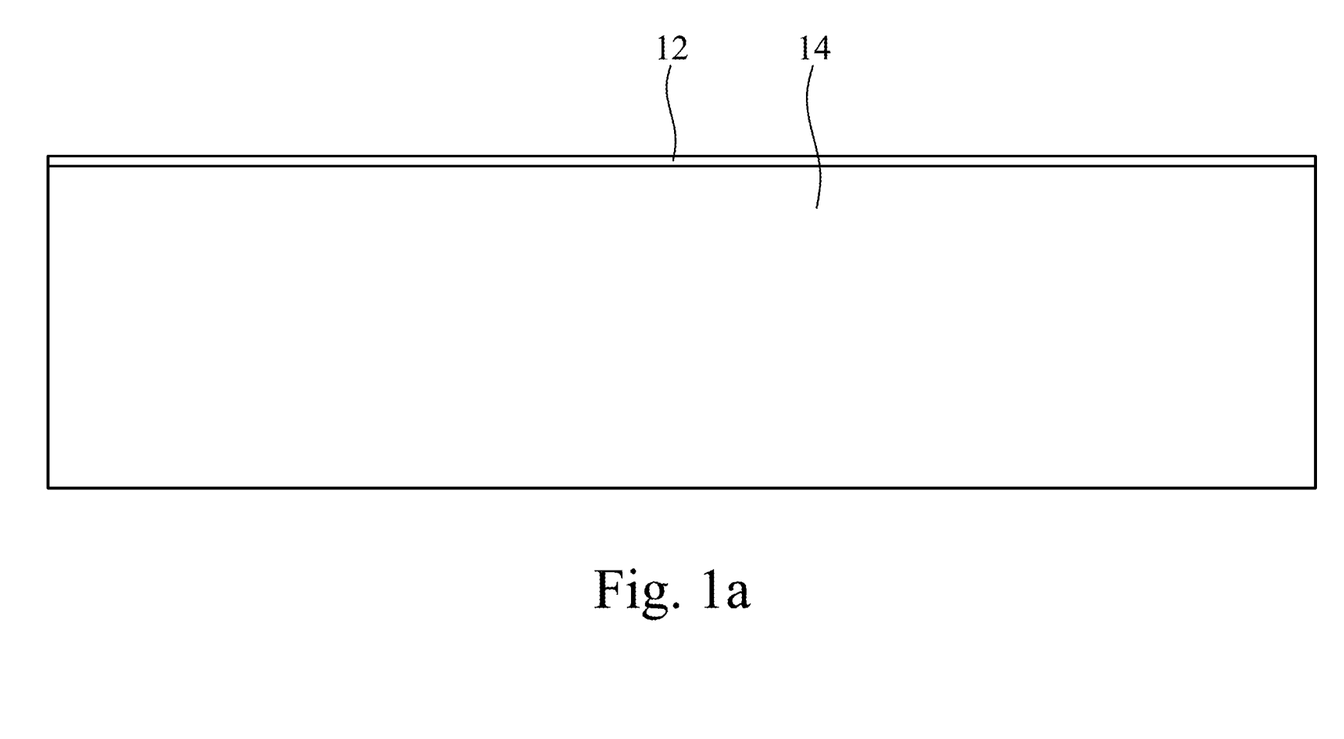
FIGS. 1A-1I collectively illustrate an embodiment method of forming a PoP device using a carrier to inhibit or prevent warping in stacked dies.

Referring now to FIGS. 1A-1I, an embodiment method of forming a PoP device 10 (FIGS. 2-4) is collectively illustrated. As shown in FIG. 1A, glue 12 or another suitable bonding material is deposited or formed on a carrier 14. In an embodiment, the carrier 14 is formed from glass, silicon, a material having a low coefficient of thermal expansion, or another suitable carrier material. Indeed, the carrier 14 is generally a higher modulus material with good stiffness.

Figure 1B:
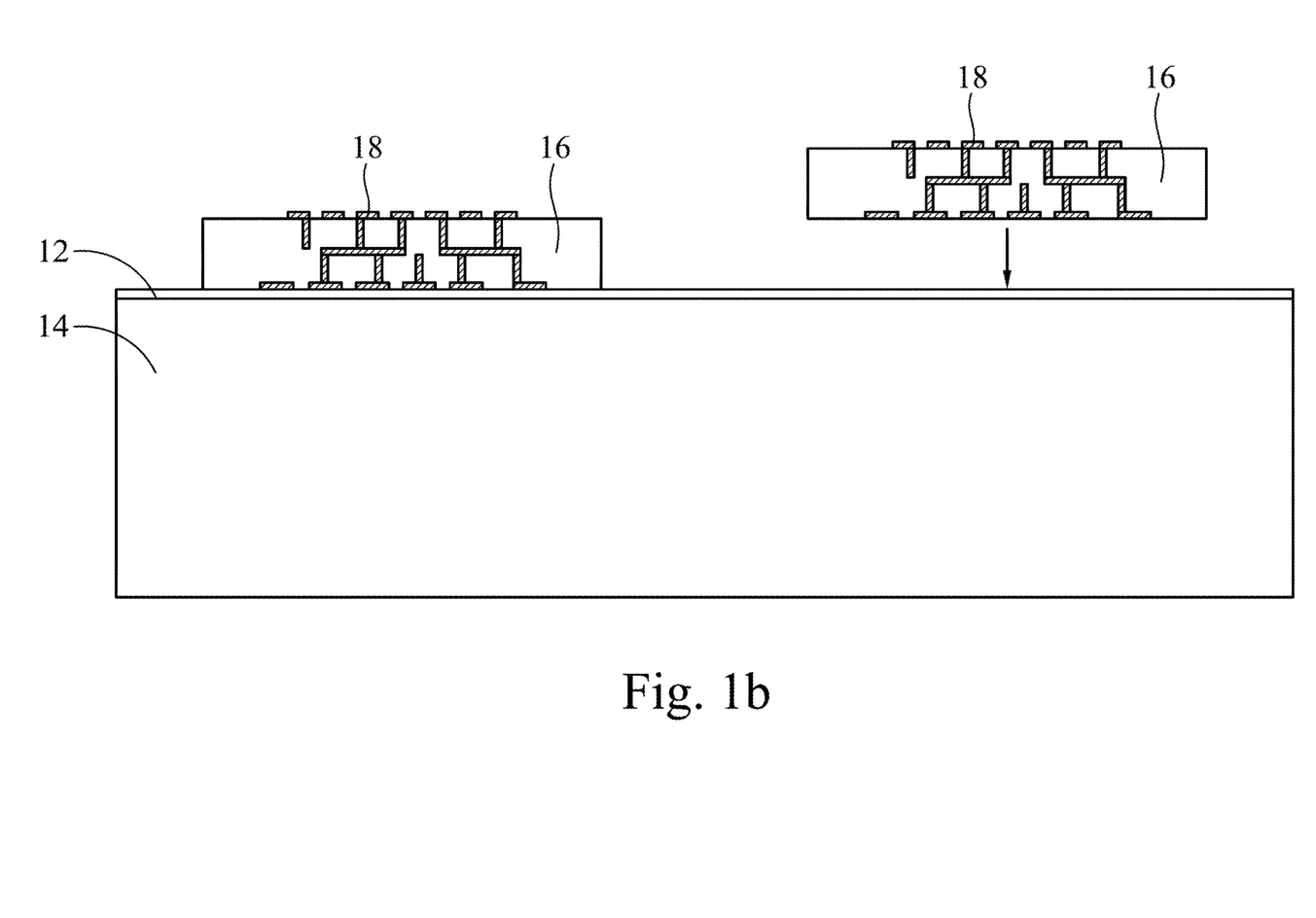

Referring now to FIG. 1B, a substrate 16 is temporarily mounted on the carrier 14 using the glue 12 or other suitable bonding material. In an embodiment, the substrate 16 is an organic substrate, a ceramic substrate, a silicon substrate, a glass substrate, or a laminate substrate having or supporting metal interconnects 18 or metallization. In an embodiment, the substrate 16 is formed from an epoxy, a resin, or another material.

Figure 1C:
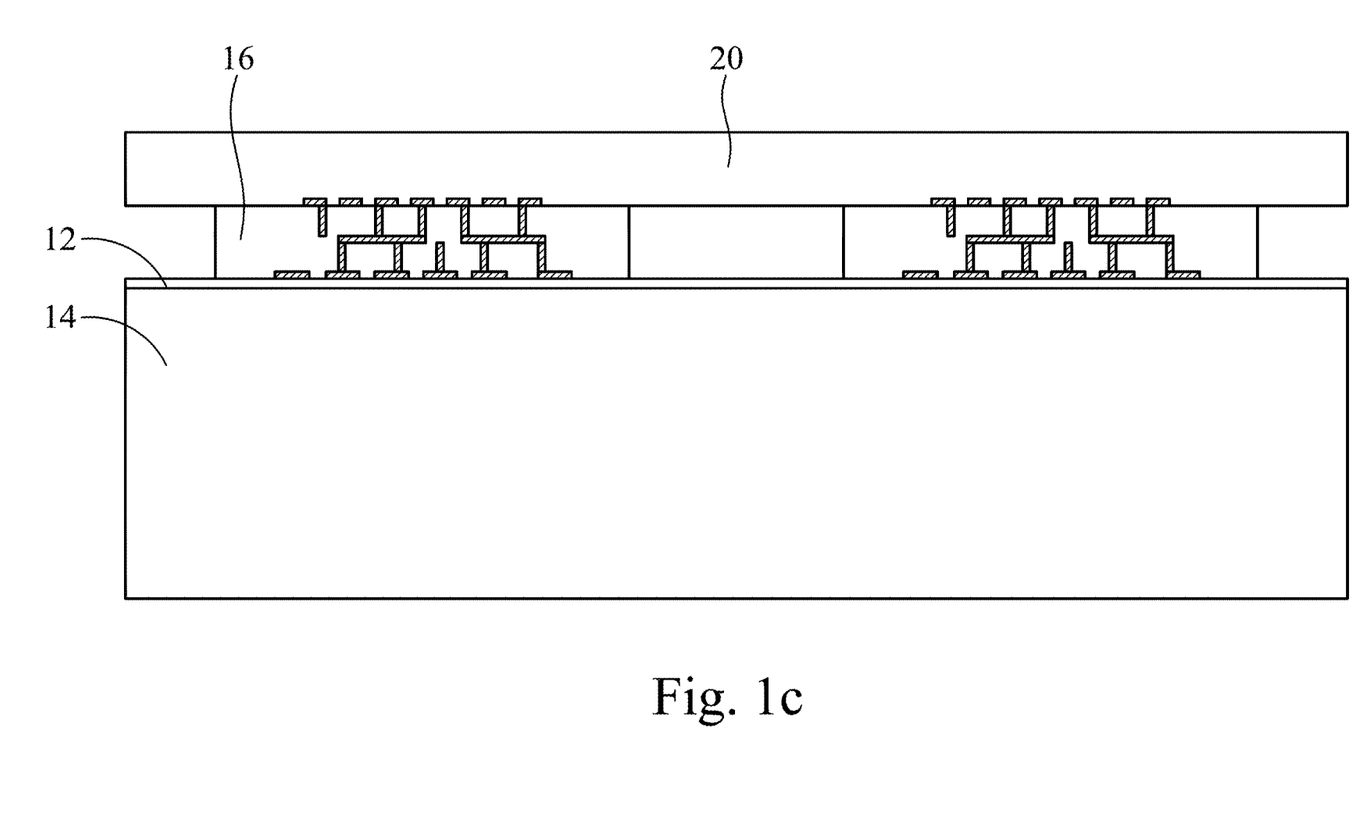

Referring now to FIG. 1C, in an embodiment a pressure anneal is performed after the substrate 16 has been temporarily mounted on the carrier 14 as shown in FIG. 1B. The pressure anneal generally biases the substrate 16 toward the carrier 14. This ensures that the substrate 16 is securely mounted, albeit temporarily, on the carrier 14. In an embodiment, the pressure anneal of FIG. 1C is performed using a pressure anneal cap 20 along with heating. In an embodiment, pressure anneal may be performed later in the embodiment method illustrated in FIGS. 1A-1I. For example, the pressure anneal may be performed on a wafer, on a panel, on a single unit, or on multiple units. In addition, in an embodiment the pressure anneal includes pressure only without the application of heat.

Figure 1D:
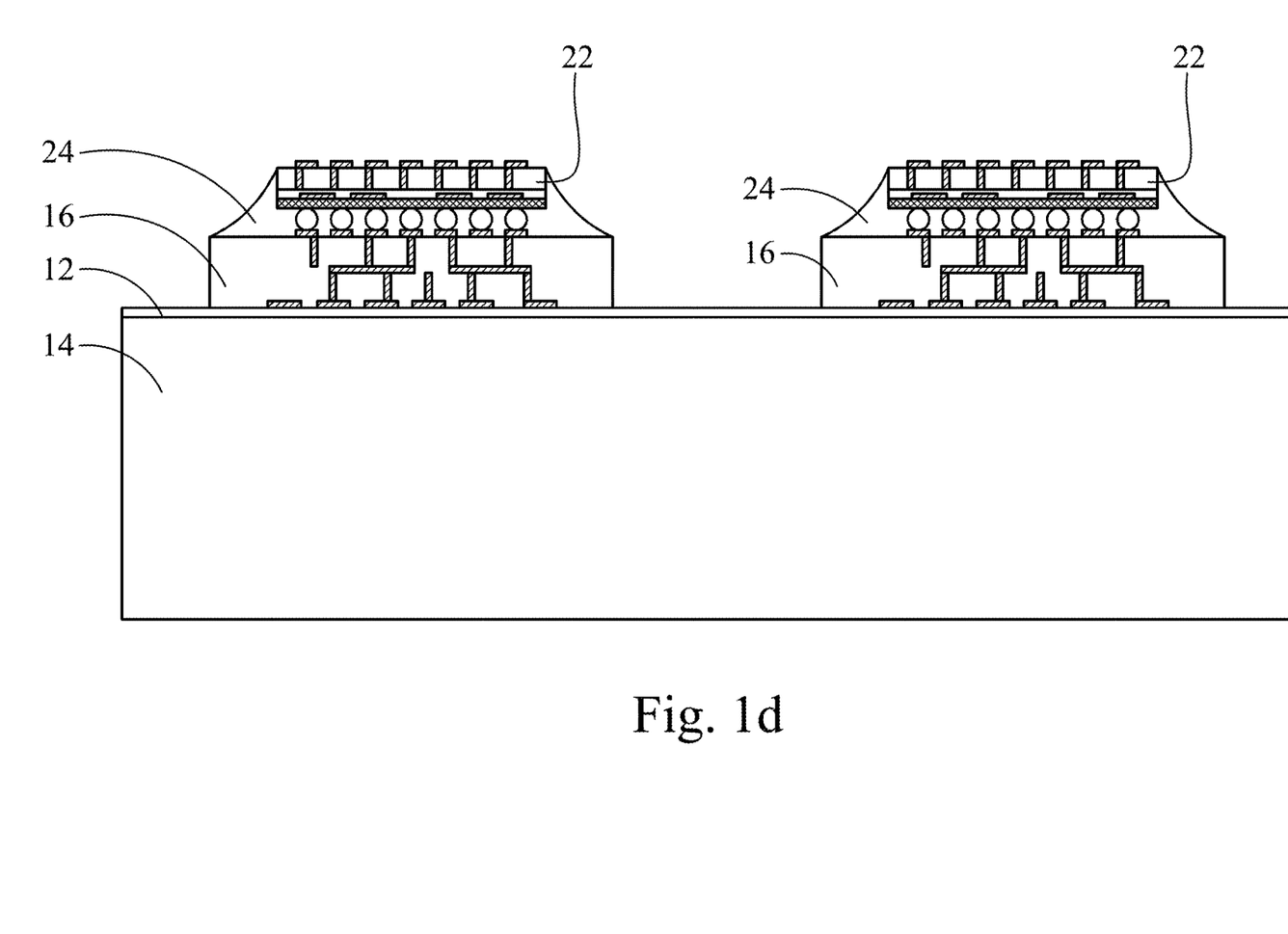

Referring now to FIG. 1D, after the pressure anneal cap 20 of FIG. 1C has been removed, a first die 22 is attached to the substrate 16 using, for example, solder balls and corresponding contact pads. The first die 22 may include logic components (a logic integrated circuit, analog circuit, etc.), a memory component, and so on. The substrate 16 and/or the die 22 generally have a material coefficient of thermal expansion mismatch relative to the carrier 14. As will be more fully explained below, any warping of, for example, dies or other semiconductor structures stacked on or over the substrate 16 is inhibited or prevented.

After placing the first die 22, an underfill material 24 may be flowed between the first die 22 and the substrate 16. In an embodiment, the underfill material 24 is omitted between the first die 22 and the substrate 16.

Figure 1E:
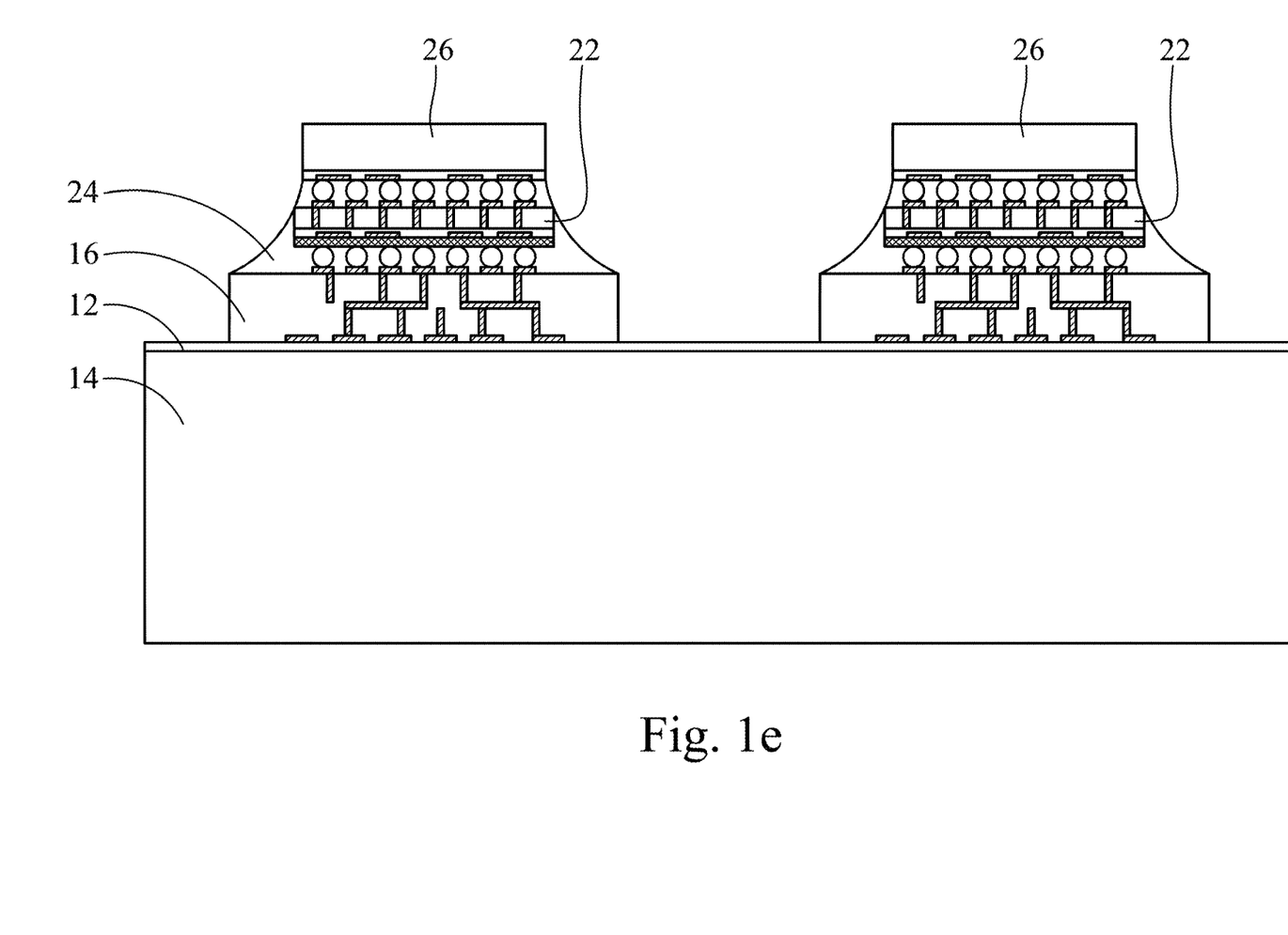

Referring now to FIG. 1E, after the first die 22 has been mounted, a second die 26 is attached over the first die 22 using, for example, solder balls and corresponding contact pads. The second die 26 may include logic components (a logic integrated circuit, analog circuit, etc.), a memory component, and so on. Notably, the stacking of the second die 26 upon the first die 22 generally forms the PoP devices 10.

After placing the second die 26 as shown in FIG. 1E, an underfill material 24 may be flowed between the second die 26 and the first die 22. In an embodiment, the underfill material 24 is omitted. As will be more fully explained below, in an embodiment the second die 26 may be horizontally offset relative to the first die 22 to provide the second die 26 with an overhang.

Figure 1F:
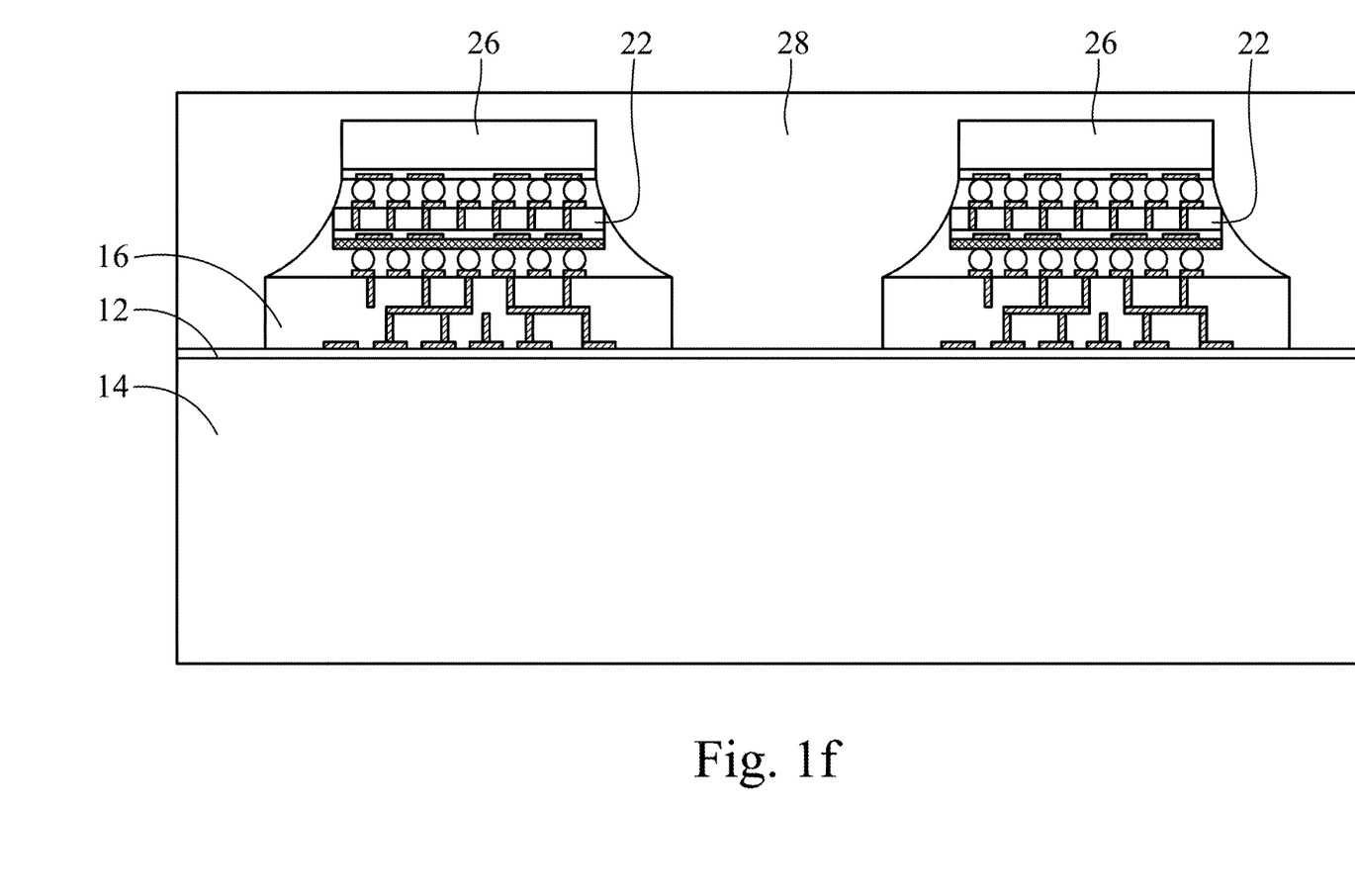

Referring now to FIG. 1F, after the second die 26 has been mounted, a molding material 28 is formed over, for example, exposed portions of the substrate 16, the first die 22, and the second die 26. In an embodiment, the molding material 28 is also formed over the glue 12 disposed on the carrier 14 and adjacent to the substrate 16. In an embodiment, the molding material 28 generally encapsulates the first and second dies 22, 26.

Figure 1G:
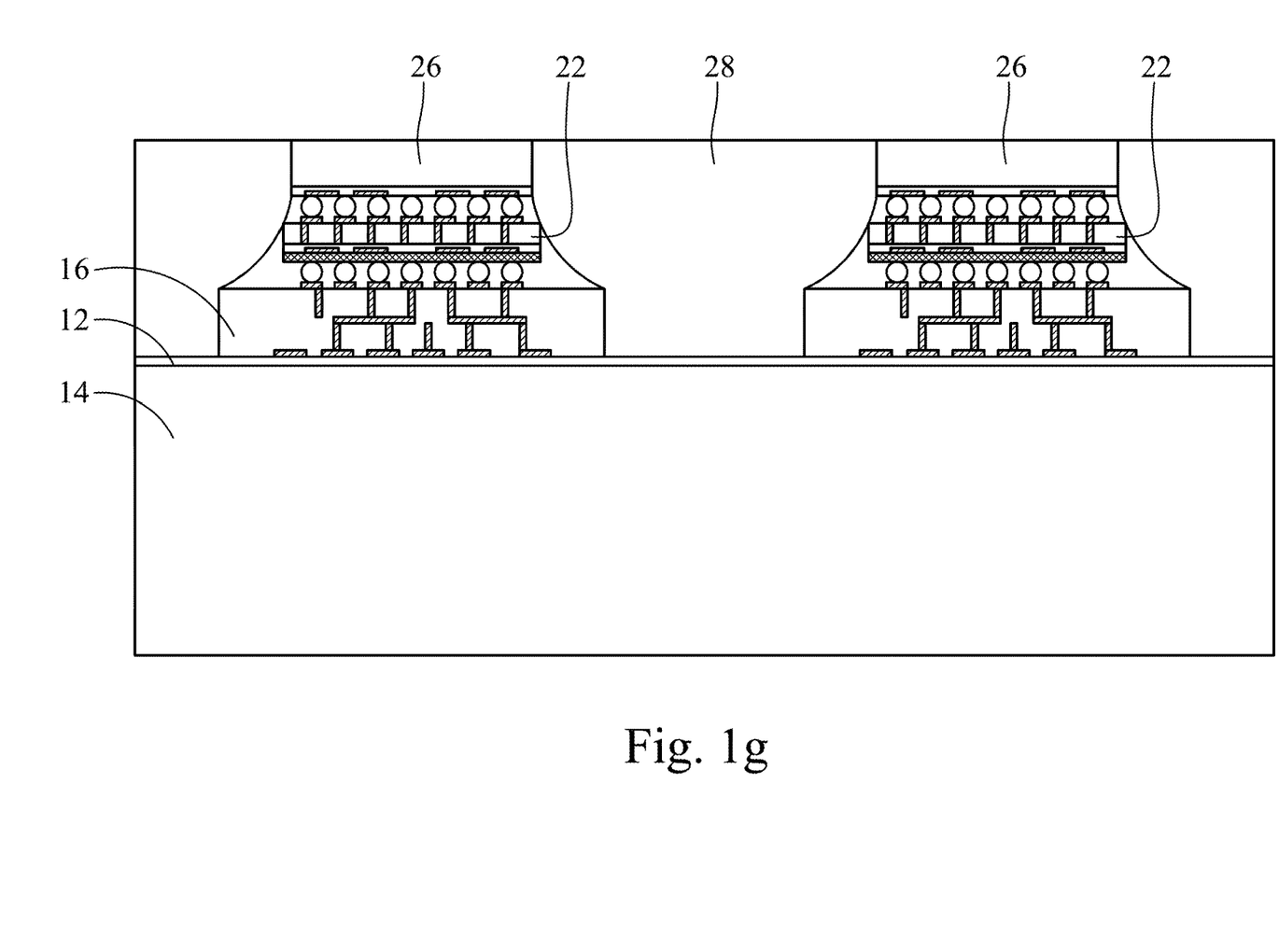

Referring now to FIG. 1G, after the molding material 28 has been formed over the first and second dies 22, 26, a grinding process is performed to remove an upper portion of the molding material 28. As shown, the grinding process may expose a top surface of the second die 26. However, in an embodiment, the grinding process may leave a portion or thin layer of the molding material 28 disposed over the second die 26.

Figure 1H:
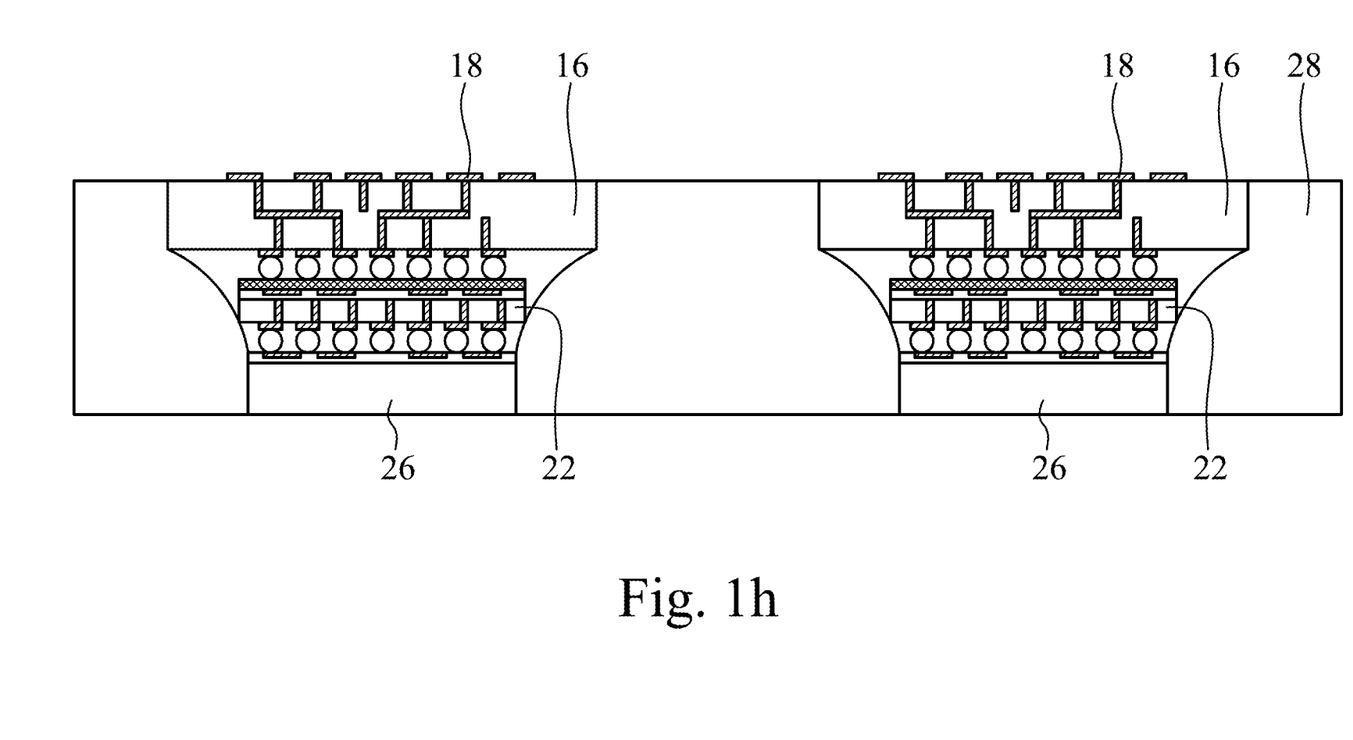

Referring now to FIG. 1H, after the grinding process has been performed, the assembly is flipped over and a de-bonding process is performed to remove the carrier 14 from the substrate 16. In addition, a cleaning process is performed to remove the glue 12 from the substrate 16 and the molding material 28. Once the de-bonding and cleaning processes have been performed, contact pads from the metal interconnects 18 of the substrate 16 are exposed.

Figure 1I:
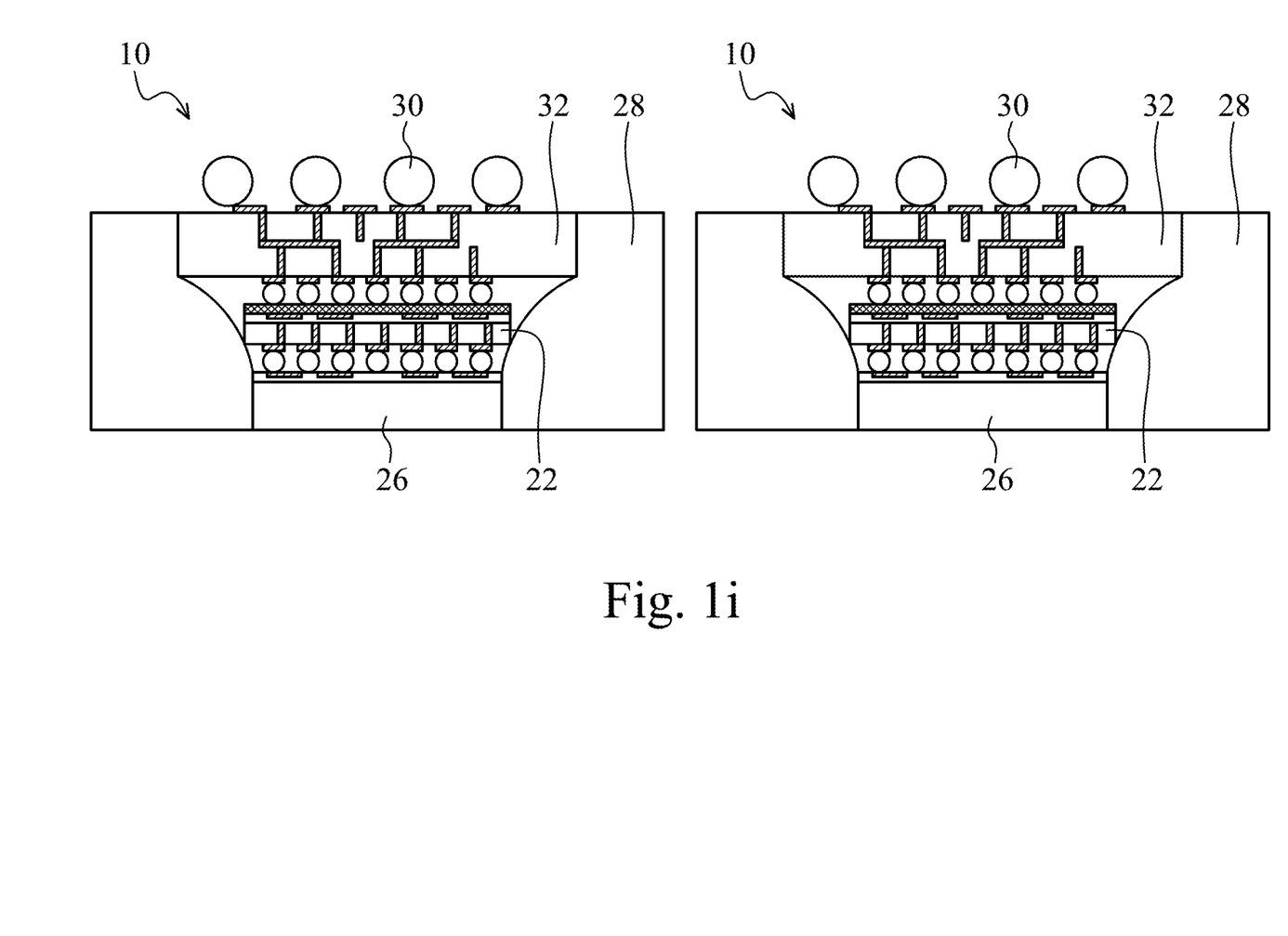

Referring now to FIG. 1I, after the de-bonding and cleaning processes have been performed, a ball mount process is performed to form an array of solder balls 30 on the contact pads from the metal interconnects 18 of the substrate 16. In addition, a wafer saw process is performed to separate the PoP devices 10 from each other. As shown in FIG. 1I, after the wafer saw process a portion of the molding material 28 still covers the sidewalls 32 of the substrate 16. However, in an embodiment the wafer saw process removes the molding material 28 from the sidewalls 32 of the substrate 16.

Figure 2:
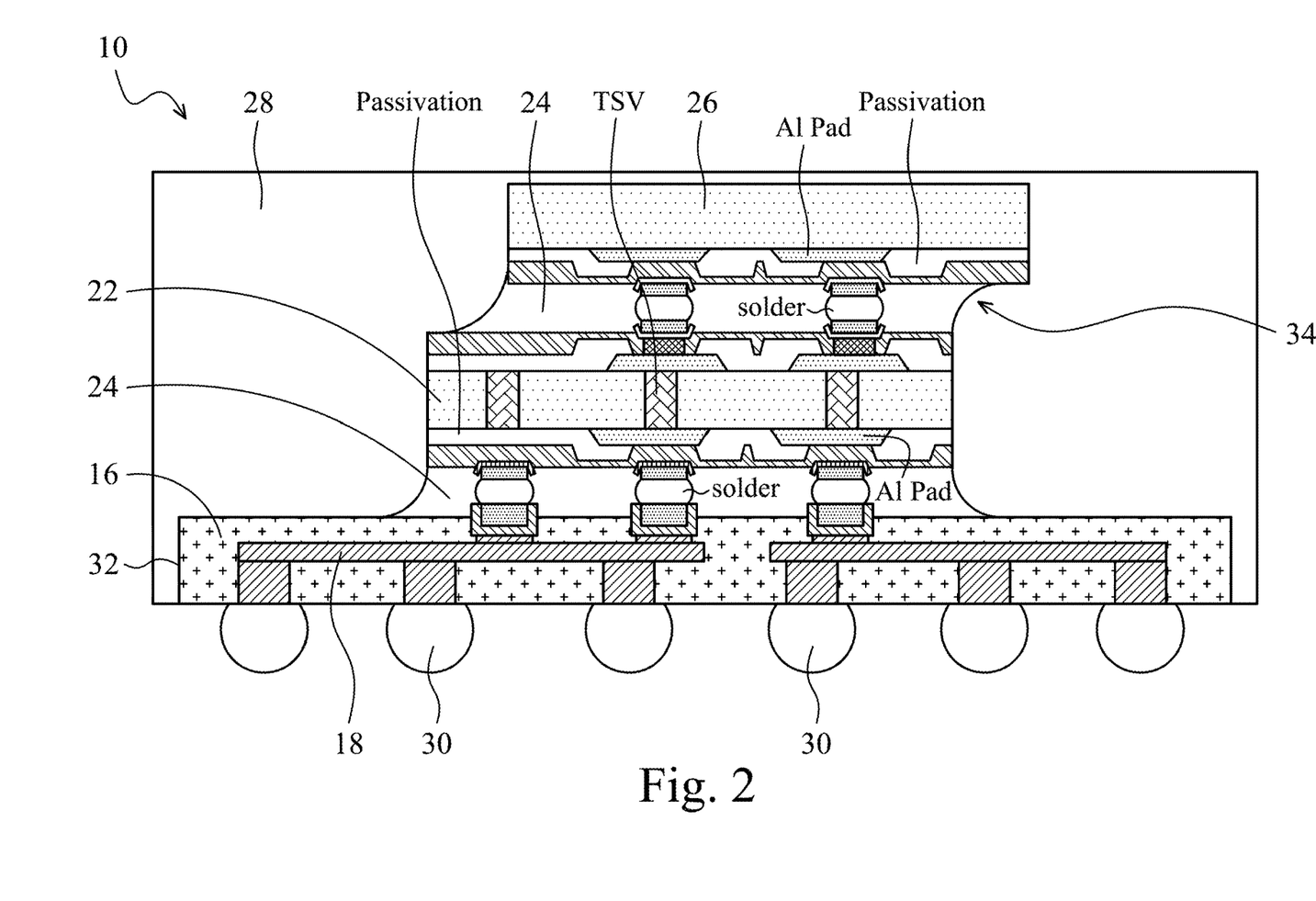
FIG. 2 illustrates a cross sectional view of an embodiment PoP device formed using the method of FIGS. 1A-1I.

Referring to FIG. 2, an embodiment PoP device 10 formed using an embodiment method is illustrated. As shown, the PoP device 10 includes a first die 22 stacked on the substrate 16 and a second die 26 stacked on the first die 22. In an embodiment, the second die 26 is horizontally offset relative to the first die 22 to provide the second die 26 with the overhang 34 noted above.

In an embodiment, the underfill material 24 is disposed between the substrate 16 and the first die 22 as well as between the first die 22 and the second die 26. In an embodiment, the underfill material 24 is disposed between the substrate 16 and the first die 22 only. In an embodiment, the underfill material 24 is disposed between the first die 22 and the second die 26 only. In addition, the molding material 28 of the PoP device 10 has been formed around portions of the substrate 16, the first die 22, and the second die 26. In an embodiment, the molding material 28 is omitted.

Still referring to FIG. 2, the substrate 16 of the PoP device 10 supports metal interconnects 18 and/or other connection structures (e.g., under bump metallization) used to electrically couple the solder balls 30 (i.e., the ball grid array) to the first die 22. The PoP device 10 may also include other structures, layers, or materials such as, for example, passivation layers, through silicon vias (TSVs), aluminum pads, solder, and so on.

Figure 3:
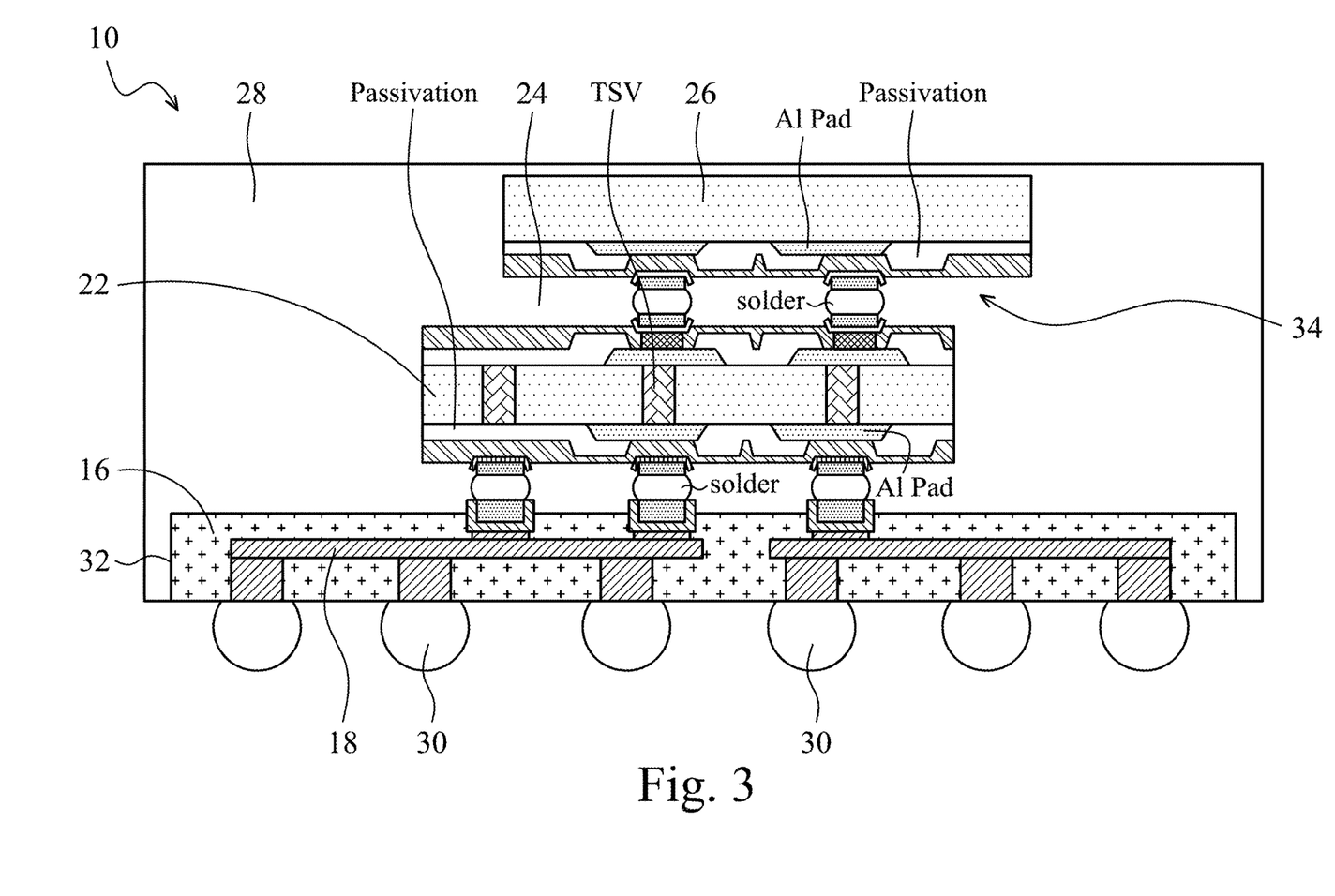
FIG. 3 illustrates a cross sectional view of an embodiment PoP device formed using the method of FIGS. 1A-1I without any underfill.

Referring now to FIG. 3, in an embodiment the underfill material 24 of FIG. 2 has been omitted from the PoP device 10 and replaced by the molding material 28. In other words, the molding material 28 functions or preforms as an underfill in the embodiment PoP device 10 of FIG. 3.

Figure 4:
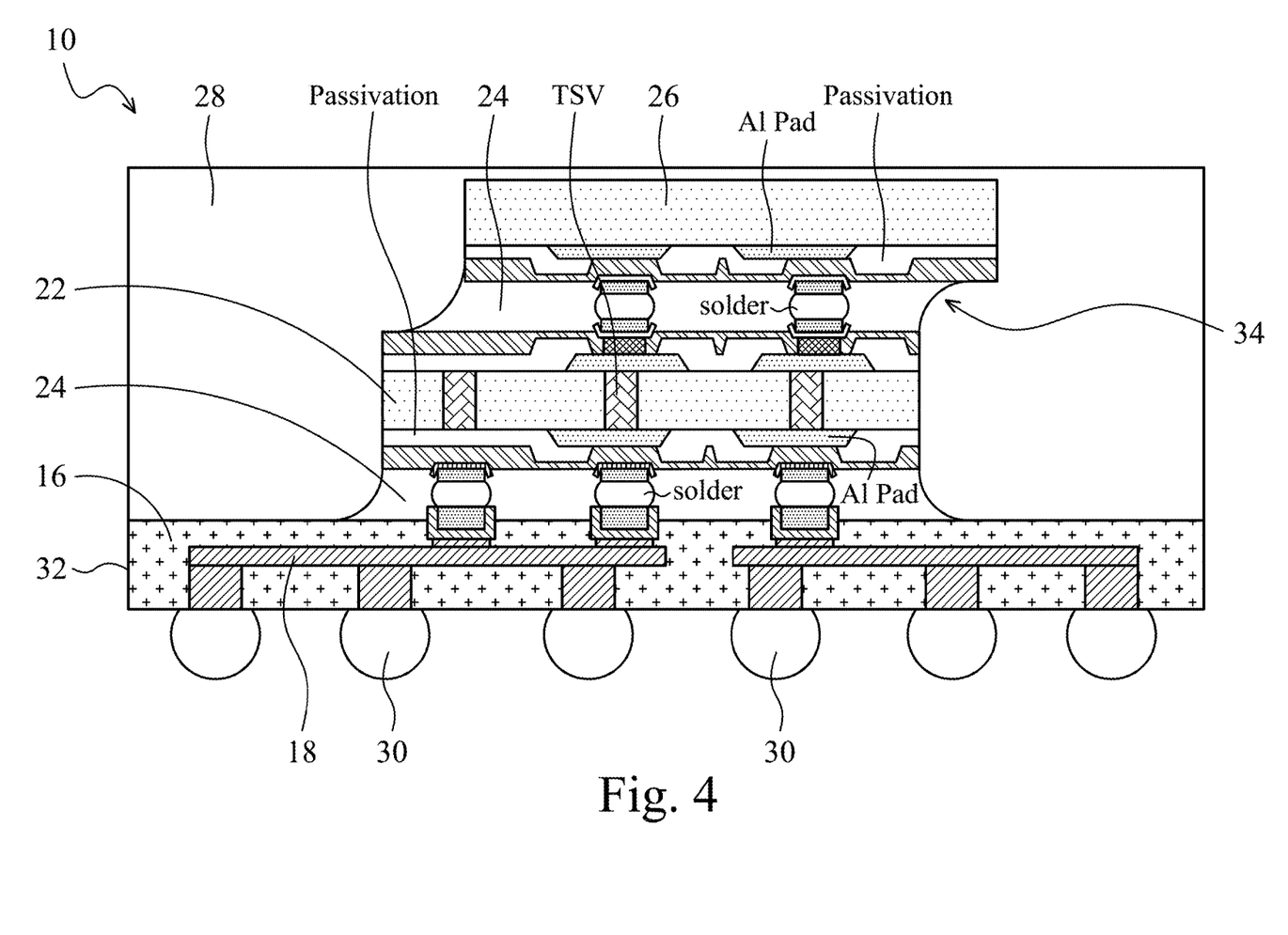
FIG. 4 illustrates a cross sectional view of an embodiment PoP device formed using the method of FIGS. 1A-1I without any molding on sidewalls of the substrate.

Referring now to FIG. 4, in an embodiment the molding material 28 is left off or removed from sidewalls 32 of the substrate 16. By way of example, the molding material 28 may not be formed on the sidewalls 32 when the molding material 28 is deposited during the molding process of FIG. 1F. In other words, the molding material 28 is prevented from forming on the sidewalls 32. In another example, the molding material 28 may be removed from the sidewalls 32 of the substrate 16 using the wafer saw process of FIG. 1I. In other words, the wafer saw removes the molding material 28 from the sidewalls 32.

It should be recognized that the embodiment methods and PoP device 10 provide numerous advantages. Indeed, by using the carrier 14 during the stacking of dies 22, 26 warping is inhibited or prevented, even when relatively thin dies are stacked. In addition, multiple dies may be stacked, either with or without an overhang.

An embodiment method of forming a package-on-package (PoP) device includes temporarily mounting a substrate on a carrier, stacking a first die on the substrate, at least one of the die and the substrate having a coefficient of thermal expansion mismatch relative to the carrier, and stacking a second die on the first die.

An embodiment method of forming a package-on-package (PoP) device includes temporarily mounting a substrate on a carrier, stacking a plurality of dies over the substrate, at least one of the plurality of dies and the substrate having a coefficient of thermal expansion mismatch relative to the carrier, and removing the carrier after the plurality of dies have been stacked.

A embodiment method of forming a package-on-package (PoP) device includes temporarily mounting a substrate on a carrier, stacking a first die on the substrate, at least one of the first die and the substrate having a coefficient of thermal expansion mismatch relative to the carrier, stacking a second die on the first die, the second die horizontally offset relative to the first die to provide the second die with an overhang, and flowing an underfill material between the first die and the substrate and between the first die and the second die.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of forming a package-on-package (PoP) device, comprising:
    temporarily mounting a substrate on a carrier, the substrate having conductive lines and vias;
    after mounting the substrate to the carrier, stacking a first die on the substrate, the first die having through vias, wherein stacking the first die on the substrate electrically couples the first die with the conductive lines and the vias of the substrate, wherein the first die comprises:
        a first substrate, wherein the through vias of the first die extend from a first surface of the first substrate facing the carrier to a second surface of the first substrate opposing the first surface;
        first aluminum pads contacting and extending along the first surface of the first substrate;
        second aluminum pads contacting and extending along the second surface of the first substrate, wherein each of the through vias is disposed between and contacts a respective first aluminum pad and a respective second aluminum pad;
        a first passivation layer along the first surface of the first substrate, wherein the first passivation layer covers first portions of the first aluminum pads and exposes second portions of the first aluminum pads;

a second passivation layer along the second surface of the first substrate, wherein the second passivation layer covers first portions of the second aluminum pads and exposes second portions of the second aluminum pads;

first conductive pillar proximate the first surface of the first substrate and electrically coupled to the exposed second portions of the first aluminum pads; and second conductive pillar proximate the second surface of the first substrate and electrically coupled to the exposed second portions of the second aluminum pads, wherein the second conductive pillars are spaced apart from the second passivation layer, wherein stacking the first die comprises bonding the first conductive pillars to the substrate using solder; and after stacking the first die, stacking a second die on the first die such that the first die is interposed between the second die and the substrate, the second die being electrically coupled to the through vias of the first die such that the first die is electrically interposed between the second die and the substrate, the second die being horizontally offset relative to the first die such that a first portion of the second die is disposed between opposing sidewalls of the first die, and a second portion of the second die is disposed outside the opposing sidewalls of the first die, wherein stacking the second die comprises bonding the second die to the second conductive pillars of the first die using solder, wherein stacking the second die electrically couples the second die with the second conductive pillars of the first die, the second conductive pillars disposed directly below the second die.

2. The method of claim 1, wherein temporary mounting the substrate comprises temporarily mounting the substrate on the carrier using glue.

3. The method of claim 1, further comprising performing a pressure anneal on the substrate using a pressure anneal cap prior to the first die and second die being stacked.

4. The method of claim 1, further comprising flowing an underfill material between the first die and the substrate but not between the first die and the second die.

5. The method of claim 1, further comprising flowing an underfill material between the first die and the second die but not between the first die and the substrate.

6. The method of claim 1, further comprising forming a molding material over exposed portions of the substrate, the first die, and the second die.

7. A method of forming a package-on-package (PoP) device, comprising:

temporarily mounting a substrate on a carrier;

bonding connectors of a first die to conductive features of the substrate after mounting the substrate, wherein the first die has a through via, wherein a length of the through via, measured along a first direction perpendicular to a major upper surface of the substrate, is smaller than a height of the first die measured along the first direction between an uppermost surface of the first die facing away from the substrate and a lowermost surface of the first die facing the substrate, wherein bonding connectors of the first die electrically couples the through via to at least one of the conductive features of the substrate;

flowing a first underfill material between the first die and the substrate after bonding connectors of the first die;

stacking a second die on the first die after flowing the first underfill material, the second die horizontally offset relative to the first die, the first die having a first sidewall and a second sidewall opposing the first sidewall, the second die having a third sidewall and a fourth sidewall opposing the third sidewall, wherein after stacking the second die, the third sidewall is laterally between the first sidewall and the second sidewall, and the second sidewall is laterally between the third sidewall and the fourth sidewall, wherein stacking the second die electrically couples the through via of the first die to a connector of the second die;

flowing a second underfill material between the first die and the second die after stacking the second die; and after flowing the second underfill material, forming a molding material over the substrate, the molding material surrounding the first die, the second die, the first underfill material, and the second underfill material.

8. The method of claim 7, further comprising forming the substrate from one of an organic substrate, a ceramic substrate, a silicon substrate, a glass substrate, and a laminate substrate.

9. The method of claim 1, further comprising removing the carrier after stacking the second die, wherein the first die remains stacked on the substrate after removing the carrier.

* * * * *

UNITED STATES PATENT AND TRADEMARK OFFICE
CERTIFICATE OF CORRECTION

PATENT NO. : 10,153,179 B2  
APPLICATION NO. : 13/779554  
DATED : December 11, 2018  
INVENTOR(S) : Jing-Cheng Lin et al.

Page 1 of 1

It is certified that error appears in the above-identified patent and that said Letters Patent is hereby corrected as shown below:

On the Title Page

Under abstract "9 Claims, 12 Drawing Sheets" should read --10 Claims, 12 Drawing Sheets--.

In the Claims

In Column 4, Line 67, Claim 1, delete "second portions of the first aluminum pads:" and insert --second portions of the first aluminum pads;--.

In Column 6, Line 46, after Claim 9, insert Claim 10 as follows:
--10. The method of claim 9, further comprising maintaining exposed portions of the substrate without the molding material thereon.--.

Signed and Sealed this
Fifth Day of November, 2019

Andrei Iancu
*Director of the United States Patent and Trademark Office*